United States Patent
Maeda et al.

(10) Patent No.: US 9,569,303 B2
(45) Date of Patent: Feb. 14, 2017

(54) INFORMATION PROCESSING APPARATUS

(71) Applicant: Kabushiki Kaisha Toshiba, Minato-ku (JP)

(72) Inventors: Kenichi Maeda, Kamakura (JP); Nobuhiro Kondo, Yokohama (JP); Kenichiro Yoshii, Bunkyo (JP); Satoshi Kaburaki, Meguro (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 33 days.

(21) Appl. No.: 14/633,693

(22) Filed: Feb. 27, 2015

(65) Prior Publication Data

US 2016/0041871 A1 Feb. 11, 2016

Related U.S. Application Data

(60) Provisional application No. 62/035,187, filed on Aug. 8, 2014.

(51) Int. Cl.
*G06F 11/10* (2006.01)
*G11C 29/04* (2006.01)

(52) U.S. Cl.
CPC ....... *G06F 11/1004* (2013.01); *G06F 11/1016* (2013.01); *G06F 11/1044* (2013.01); *G06F 11/1064* (2013.01); *G06F 11/1072* (2013.01); *G11C 2029/0411* (2013.01)

(58) Field of Classification Search
CPC .................................................. G06F 11/1004
See application file for complete search history.

(56) References Cited

U.S. PATENT DOCUMENTS

| | | | | |
|---|---|---|---|---|
| 5,146,588 A | * | 9/1992 | Crater | G06F 11/1008 714/6.1 |
| 5,359,569 A | * | 10/1994 | Fujita | G06F 12/0804 365/185.09 |
| 5,537,534 A | * | 7/1996 | Voigt | G06F 11/1076 711/114 |
| 5,546,348 A | * | 8/1996 | Honma | G06F 3/0601 365/230.03 |

(Continued)

FOREIGN PATENT DOCUMENTS

| | | |
|---|---|---|
| JP | 4-24830 | 1/1992 |
| JP | 5-274223 | 10/1993 |
| JP | 2013-109419 | 6/2013 |

*Primary Examiner* — Joseph D Torres
(74) *Attorney, Agent, or Firm* — Oblon, McClelland, Maier & Neustadt, L.L.P.

(57) ABSTRACT

According to one embodiment, an information processing apparatus includes a host and a memory system. The memory system includes a nonvolatile memory. The host includes a volatile memory, a first host control unit, and a second host control unit. The volatile memory includes a first area to be used by the host and a second area as a cache memory to temporarily store data of the nonvolatile memory. The first host control unit computes a first code, and stores the first data and the first code in the second area. The first code is redundant information of the first data. The second host control unit reads second data and a second code from the second area, performs error detection on the second data based on the second code, and transfers the second data. The second code is redundant information of the second data.

14 Claims, 11 Drawing Sheets

(56) References Cited

U.S. PATENT DOCUMENTS

| | | | | |
|---|---|---|---|---|
| 5,682,396 | A * | 10/1997 | Yamamoto | G06F 11/1076 714/6.1 |
| 5,734,813 | A * | 3/1998 | Yamamoto | G06F 3/0601 707/999.202 |
| 5,872,800 | A * | 2/1999 | Glover | G11B 20/1833 360/53 |
| 5,958,078 | A * | 9/1999 | Yamamoto | G06F 11/1076 714/766 |
| 6,012,123 | A * | 1/2000 | Pecone | G06F 11/1076 711/111 |
| 6,012,839 | A * | 1/2000 | Nguyen | G06F 11/1004 714/755 |
| 7,322,002 | B2 * | 1/2008 | Keays | G06F 11/1048 714/763 |
| 2003/0115437 | A1 * | 6/2003 | Tomita | G06F 3/0601 711/203 |
| 2009/0307430 | A1 * | 12/2009 | Bruening | G06F 12/0862 711/119 |
| 2010/0269017 | A1 * | 10/2010 | Bueb | G06F 11/1048 714/763 |
| 2011/0302358 | A1 * | 12/2011 | Yu | G06F 11/108 711/103 |
| 2012/0166910 | A1 * | 6/2012 | Baek | G06F 11/1044 714/758 |
| 2013/0104001 | A1 * | 4/2013 | Nakanishi | G06F 11/1048 714/758 |
| 2013/0191609 | A1 | 7/2013 | Kunimatsu et al. | |
| 2014/0189202 | A1 * | 7/2014 | Hosaka | G06F 3/0616 711/103 |
| 2014/0245098 | A1 * | 8/2014 | Sharon | G06F 11/1012 714/755 |
| 2014/0258811 | A1 * | 9/2014 | Liu | G06F 11/1044 714/766 |

* cited by examiner

FIG.6
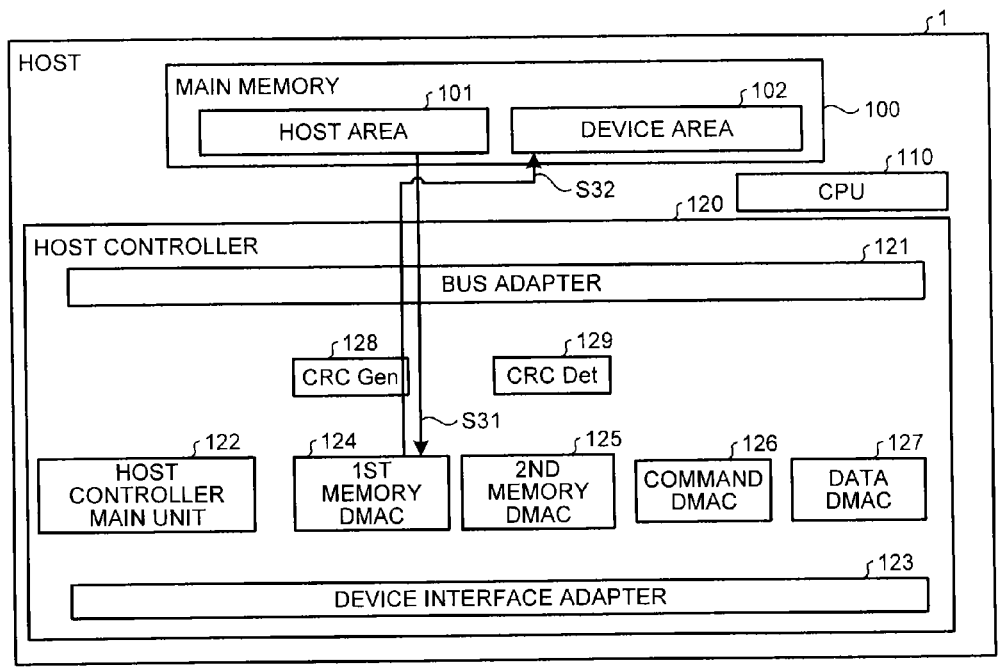
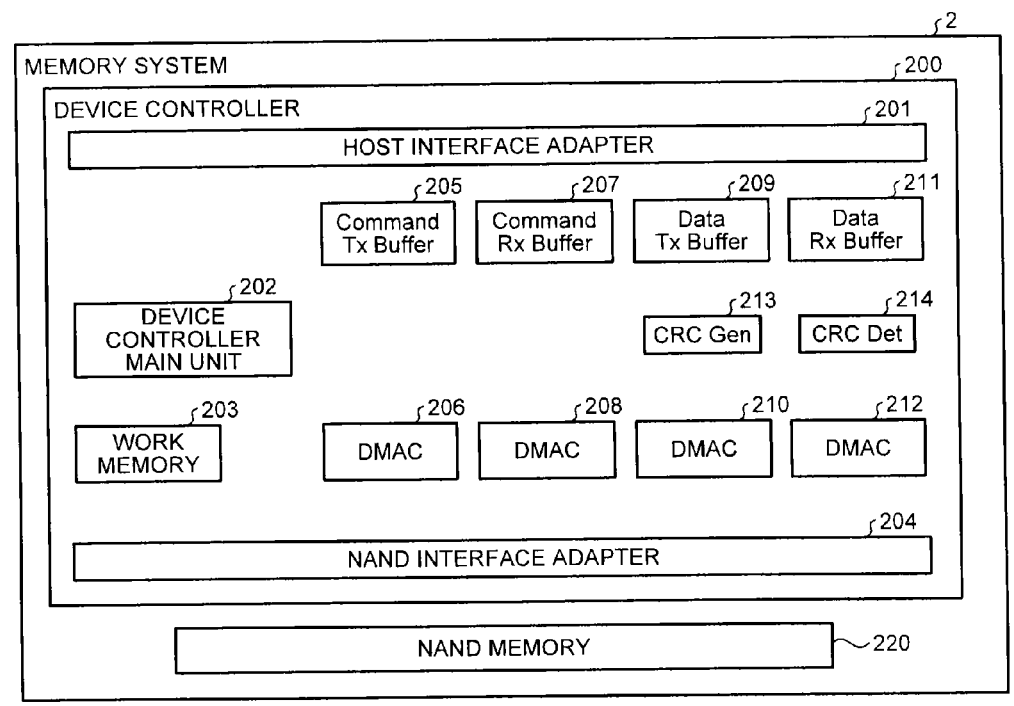

INFORMATION PROCESSING APPARATUS

CROSS-REFERENCE TO RELATED APPLICATIONS

This application is based upon and claims the benefit of priority from U.S. Provisional Application No. 62/035,187, filed on Aug. 8, 2014; the entire contents of which are incorporated herein by reference.

FIELD

Embodiments described herein relate generally to an information processing apparatus.

BACKGROUND

Conventionally, UMA (Unified Memory Architecture) has been known as a memory architecture for information processing apparatuses. The UMA is a memory architecture in which a memory mounted in a host is shared by the host and devices. With the UMA, a reduction in memory cost can be achieved.

BRIEF DESCRIPTION OF THE DRAWINGS

FIG. 6 is a diagram for explaining the operation of the host executing a first copy command;

DETAILED DESCRIPTION

In general, according to one embodiment, an information processing apparatus includes a host and a memory system. The memory system includes a nonvolatile memory. The host includes a volatile memory, a first host control unit, and a second host control unit. The volatile memory includes a first area to be used by the host and a second area as a cache memory to temporarily store data of the nonvolatile memory. The first host control unit computes a first code, and stores the first data and the first code in the second area. The first code is redundant information of the first data. The second host control unit reads second data and a second code from the second area, performs error detection on the second data based on the second code, and transfers the second data. The second code is redundant information of the second data.

Exemplary embodiments of an information processing apparatus will be explained below in detail with reference to the accompanying drawings. The present invention is not limited to the following embodiments.

Embodiment

Figure 1:
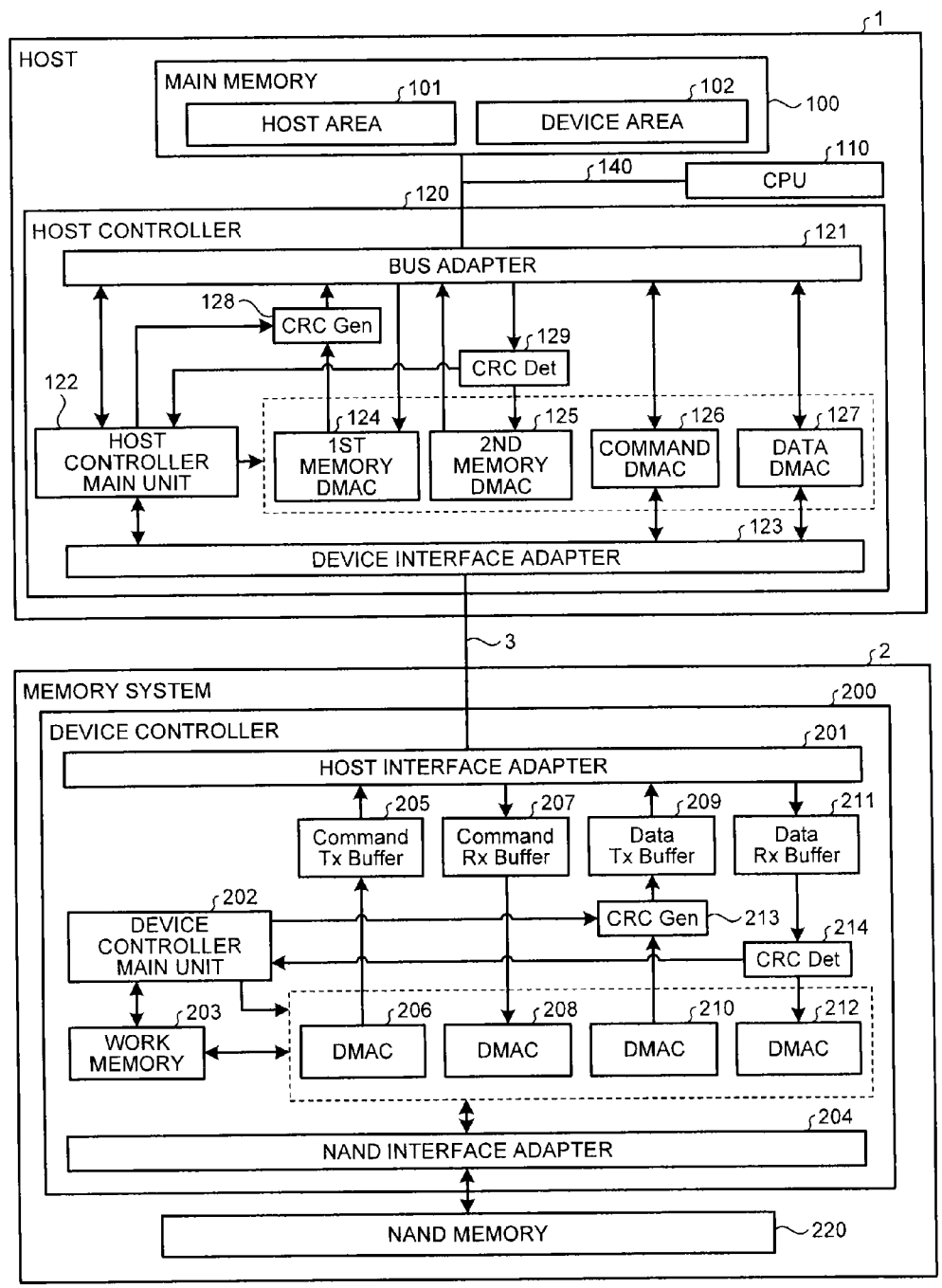
FIG. 1 is a diagram showing an example configuration of an information processing apparatus of an embodiment.

FIG. 1 is a diagram showing an example configuration of an information processing apparatus of the embodiment. The information processing apparatus comprises a host 1 and a memory system 2 that functions as an external storage device for the host 1. The host 1 and the memory system 2 are connected via a communication path 3. The UMA is adopted as the memory architecture of the information processing apparatus.

The information processing apparatus is, for example, a server, a personal computer, a mobile telephone, an imaging device, or the like. Any standard can be applied to the standard that the memory system 2 conforms to and the standard of the communication path 3. The memory system 2 is, for example, a flash memory conforming to UFS (Universal Flash Storage) Standard. For example, MIPI (Mobile Industry Processor Interface) M-PHY can be applied as the communication standard of the communication path 3.

The memory system 2 comprises a NAND flash memory (NAND memory) 220 as a nonvolatile memory and a device controller 200 that performs data transfer between the NAND memory 220 and the host 1. A memory of another type than the NAND flash memory can be applied as the nonvolatile memory of the memory system 2. For example, an MRAM (magnetoresistive random access memory), an ReRAM (resistance random access memory), an FeRAM (Ferroelectric Random Access Memory), or the like can be applied.

The NAND memory 220 stores user data transmitted from the host 1. The user data includes, for example, an operating system program that provides an execution environment of the host 1, a user program that the host 1 executes on the OS, or data that the OS or user program inputs/outputs.

The device controller 200 comprises a host interface adapter 201 that is a connection interface for the communication path 3, a device controller main unit 202 that performs the control of the device controller 200, a work memory 203, and a NAND interface adapter 204 that is a connection interface with the NAND memory 220.

The work memory 203 is constituted by a memory device that operates at higher speed than the NAND memory 220. The work memory 203 is constituted by, e.g., a RAM (random access memory). The work memory 203 is used as a buffer for data transfer between the NAND memory 220 and the host 1. Further, the work memory 203 is used as a command queue that queues commands received from the host 1.

The device controller 200 further comprises a command Tx buffer 205, a DMAC (direct memory access controller) 206, a command Rx buffer 207, and a DMAC 208. The DMAC 206 performs command transfer from the work memory 203 to the command Tx buffer 205. The commands stored in the command Tx buffer 205 are transmitted by the host interface adapter 201 to the host 1. Commands from the host 1 are stored into the command Rx buffer 207 by the host interface adapter 201. The DMAC 208 transfers commands from the command Rx buffer 207 to the work memory 203.

Transfers by the DMACs 206 and 208 are started by the device controller main unit 202.

The device controller 200 further comprises a data Tx buffer 209, a DMAC 210, a data Rx buffer 211, and a DMAC 212. The DMAC 210 performs the transfer of data from the work memory 203 or the NAND memory 220 to the data Tx buffer 209. Data stored in the data Tx buffer 209 is transmitted by the host interface adapter 201 to the host 1. Data from the host 1 is stored by the host interface adapter 201 into the data Rx buffer 211. The DMAC 212 performs the transfer of data from the data Rx buffer 211 to the work memory 203 or the NAND memory 220. Transfers by the DMACs 210 and 212 are started by the device controller main unit 202. Herein, for avoidance of complexity, description will be made supposing that the DMAC 210 performs transfer from the NAND memory 220 to the data Tx buffer 209 and that the DMAC 212 performs transfer from the data Rx buffer 211 to the NAND memory 220.

The device controller 200 further comprises a CRC generator (CRC gen) 213 and a CRC detector (CRC det) 214. The CRC gen 213 is provided between the DMAC 210 and the data Tx buffer 209. The CRC gen 213 can compute a CRC code from data to be sent to the data Tx buffer 209 and attach the CRC code to the data. Whether to compute and attach a CRC code is set in the CRC gen 213 by the device controller main unit 202. Further, the CRC det 214 is provided between the data Rx buffer 211 and the DMAC 212. A CRC code is attached to data to be stored into the data Rx buffer 211, and the CRC det 214 can determine whether that data has an error based on the CRC code. The CRC code, after used, is discarded. The error detecting result of the CRC det 214 is transmitted to the device controller main unit 202.

The device controller main unit 202 is configured with, e.g., a computing unit. The functions of the device controller main unit 202 are realized by the computing unit executing a firmware program. The device controller main unit 202 controls data transfer based on a command from the host 1 stored in the work memory 203. The device controller main unit 202, in accessing the host 1, generates a command to the host 1 and controls the transfer of that command. The device controller main unit 202 performs the control of the DMACs 206, 208, 210, 212 and the CRC gen 213 in order to control the transfer of data or commands.

The host 1 comprises a CPU 110 that executes an OS and user programs, a memory 100 (e.g., the main memory of the host 1, hereinafter a main memory 100), and a host controller 120. The main memory 100, CPU 110, and host controller 120 are connected to each other via a bus 140.

The main memory 100 is constituted by, e.g., a RAM. The main memory 100 may be, for example, an MRAM (Magnetoresistive Random Access Memory), an ReRAM (resistance random access memory), or an FeRAM (Ferroelectric Random Access Memory). The main memory 100 comprises a host area 101 and a device area 102. The host area 101 is used as a program expansion area when the host 1 executes programs (OS and user programs) and a work area when the host 1 executes programs expanded in the program expansion area. The device area 102 is a memory area that the memory system 2 uses. For example, a fixed memory area of the main memory 100 is assigned as the device area 102.

Figure 2:
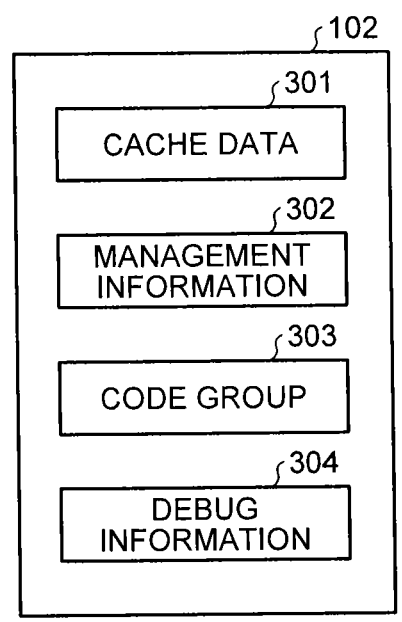
FIG. 2 is a diagram showing an example of data stored in a device area.

FIG. 2 is a diagram showing an example of data stored in the device area 102. Cache data 301, management information 302, a code group 303, debug information 304, and the like are stored in the device area 102. The cache data 301 is cached user data. The management information 302 includes, for example, translation information that describes the correspondence relation between logical addresses that the host 1 uses to specify access destinations in the memory system 2 and physical addresses in the NAND memory 220. The management information 302 is read and updated by the device controller main unit 202. The code group 303 is a set of program codes forming the firmware program that controls the device controller main unit 202. The device controller main unit 202 can sequentially acquire microcodes forming the code group 303 from the device area 102 and execute. The debug information 304 describes the history (error information) of errors which occurred in the memory system 2. The debug information 304 is created by the device controller main unit 202 and stored into the device area 102.

The management information 302 and the debug information 304 are transferred from the device area 102 to the NAND memory 220 before power-off. The management information 302, the code group 303, and the debug information 304 are transferred from the NAND memory 220 to the device area 102 at power-on.

The host controller 120 comprises a bus adapter 121, a host controller main unit 122, and a device interface adapter 123. The bus adapter 121 is a connection interface for the bus 140. The host controller main unit 122 may include a work memory to store code or data necessary for control as needed. The device interface adapter 123 is a connection interface for the communication path 3. The host controller main unit 122 can transmit and receive commands to and from the CPU 110 via the bus adapter 121 and transmit commands to the memory system 2 via the device interface adapter 123.

The host controller 120 further comprises a first memory DMAC 124, a second memory DMAC 125, a command DMAC 126, and a data DMAC 127. The first memory DMAC 124 performs data transfer from the host area 101 to the device area 102. The second memory DMAC 125 performs data transfer from the device area 102 to the host area 101. The command DMAC 126 captures commands from the memory system 2 to transfer to the host controller main unit 122. The data DMAC 127 performs data transfer between the device area 102 and the memory system 2.

The host controller 120 further comprises a CRC gen 128 and a CRC det 129. The CRC gen 128 is provided between the first memory DMAC 124 and the bus adapter 121. The CRC gen 128 can compute a CRC code from data to be transferred from the host area 101 to the device area 102 and attach the CRC code to the data. Whether to compute and attach a CRC code is set in the CRC gen 128 by the host controller main unit 122. Further, the CRC det 129 is provided between the second memory DMAC 125 and the bus adapter 121. A CRC code is attached to data to be transferred from the host area 101 to the device area 102, and the CRC det 129 can determine whether that data has an error based on the CRC code. The CRC code, after used, is discarded. The error detecting result of the CRC det 129 is transmitted to the host controller main unit 122.

In this embodiment, the host controller main unit 122 with the first memory DMAC 124 and the CRC gen 128 functions as a first host control unit. In this embodiment, the host controller main unit 122 with the second memory DMAC 125 and the CRC det 129 functions as a second host control unit. In this embodiment, the host controller main unit 122 with the data DMAC 127 functions as a third host control unit. In this embodiment, the device controller main unit 202 with the DMAC 206 functions as a first memory control unit. In this embodiment, the device controller main unit 202 with the DMAC 212 and the CRC det 214 functions as a second memory control unit. In this embodiment, the device controller main unit 202 with the DMAC 210 and the CRC gen 213 functions as a third memory control unit.

Next, the operation of the information processing apparatus of the first embodiment will be described showing the flows of data and commands.

Figure 3:
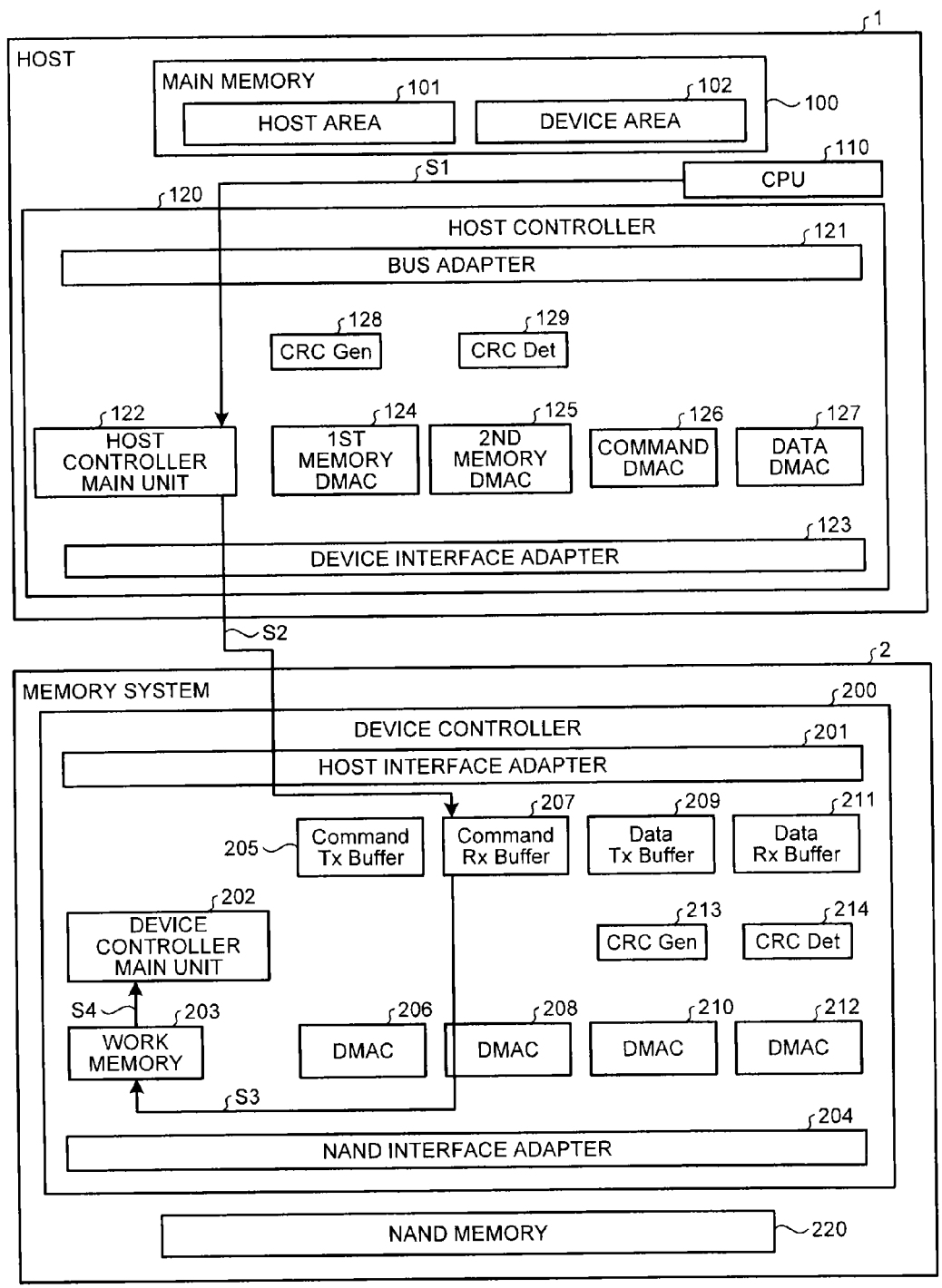
FIG. 3 is a diagram for explaining the operation of a host transmitting a command to a memory system.

FIG. 3 is a diagram for explaining the operation of the host 1 transmitting a command to the memory system 2. When the CPU 110 issues a command, the issued command is sent via the bus adapter 121 to the host controller main unit 122 (S1). It is supposed that the command is a read command or write command. The command includes a source address and a destination address. The read command includes a logical address as the source address and an address in the host area 101 as the destination address. The destination address included in the read command indicates the address to transfer user data into. The write command includes an address in the host area 101 as the source address and a logical address as the destination address. The source address included in the write command indicates the source to transfer to-be-written user data created by the CPU 110 from. The host controller main unit 122 stores the address in the host area 101 included in the received command to remove from the command and transmits the command having had that address removed to the memory system 2 (S2). The command is transferred via the device interface adapter 123, the communication path 3, and the host interface adapter 201 and stored into the command Rx buffer 207. In the memory system 2, the DMAC 208 stores the command stored in the command Rx buffer 207 into the work memory 203 (S3), and the device controller main unit 202 reads the command stored in the work memory 203 (S4).

Figure 4:
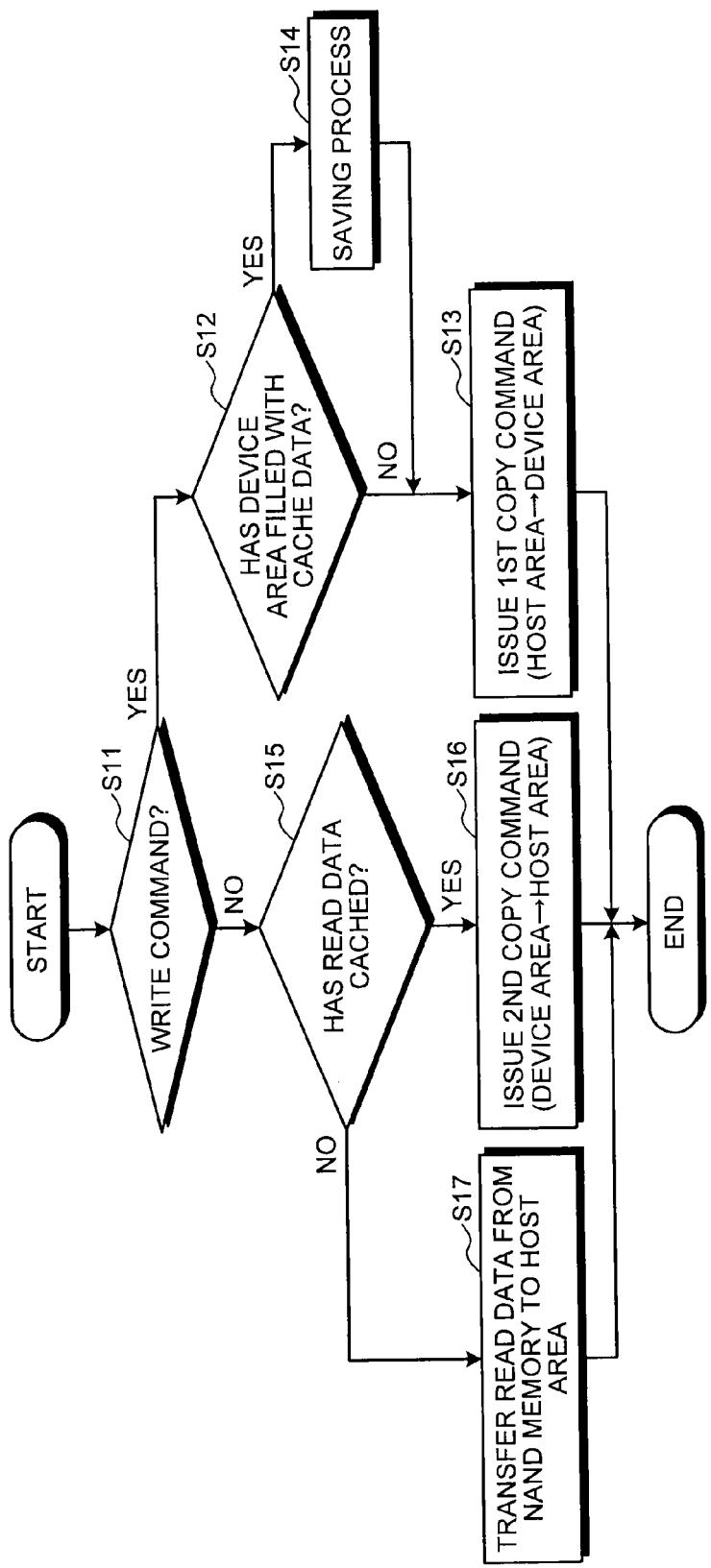
FIG. 4 is a flow chart for explaining control by a device controller main unit.

FIG. 4 is a flow chart for explaining control by the device controller main unit 202 that has read the command. The device controller main unit 202 determines whether the command read from the work memory 203 is a write command (S11). If the command is a write command (Yes at S11), then the device controller main unit 202 determines whether the device area 102 is filled with cache data 301 (S12). The device area 102 being filled with cache data 301 means that no space to cache data (write data) that the write command has requested to write exists in the device area 102. If the device area 102 is not filled with cache data 301 (No at S12), then the device controller main unit 202 generates a copy command (first copy command) to copy the write data from the host area 101 into the device area 102 and transmits to the host 1 (S13). Then the device controller main unit 202 finishes the operation.

Figure 5:
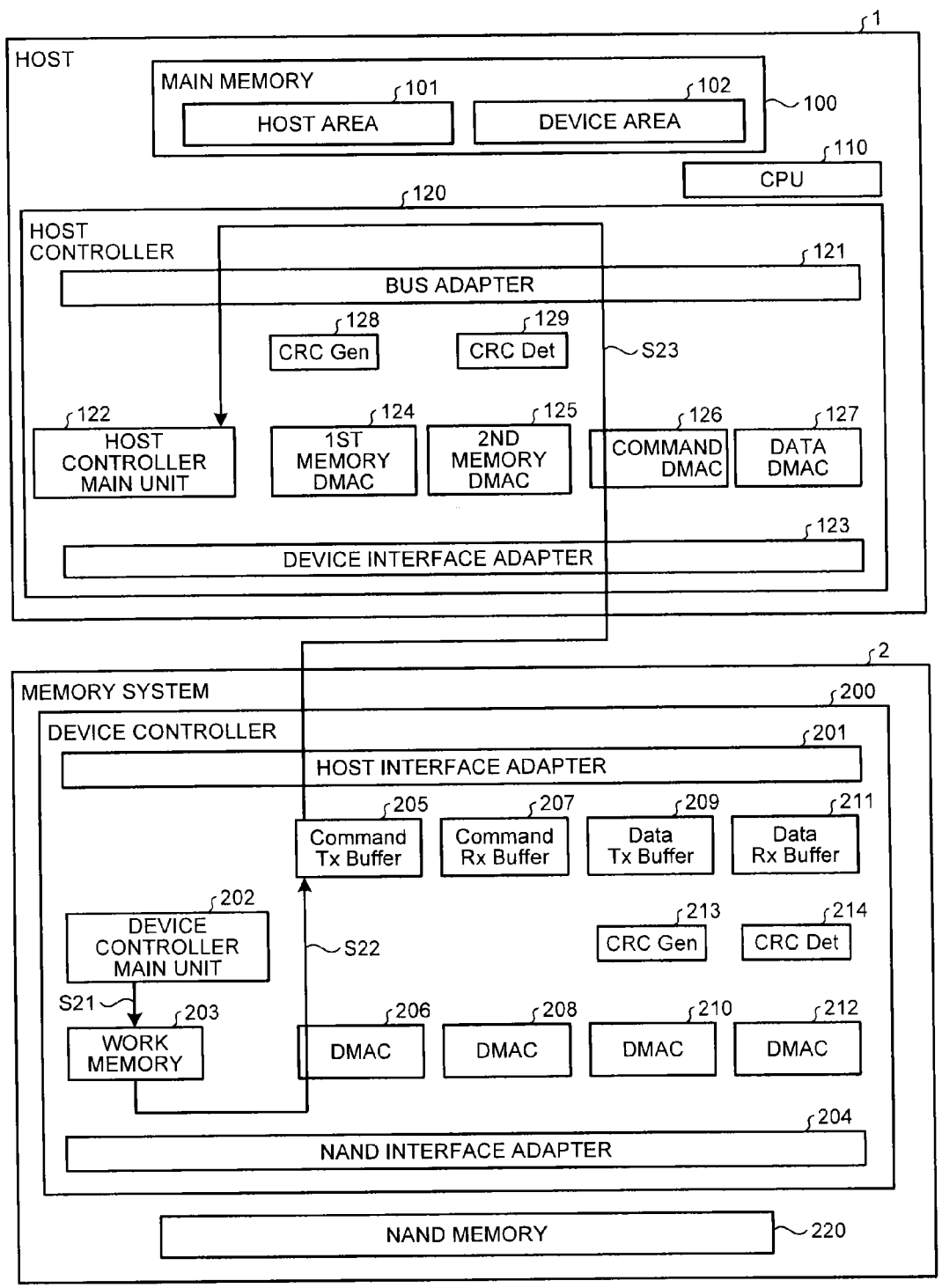
FIG. 5 is a diagram for explaining transfer paths of a command generated by the memory system.

FIG. 5 is a diagram for explaining transfer paths of commands generated by the memory system 2 including the first copy command generated by the process of S13. The device controller main unit 202 stores a generated command into the work memory 203 (S21). The DMAC 206 transfers the command stored in the work memory 203 to the command Tx buffer 205 (S22). The command stored in the command Tx buffer 205 is sent via the host interface adapter 201, the device interface adapter 123, the command DMAC 126, and the bus adapter 121 to the host controller main unit 122 (S23).

Note that copy commands include a second copy command to copy data from the device area 102 into the host area 101 as well as the first copy command. The copy commands include an address in the device area 102. In the case of the first copy command, the address in the device area 102 is used as a source address. In the case of the second copy command, the address in the device area 102 is used as a destination address. The copy commands further include direction information indicating a copy direction. The direction information indicates whether the copy command is the first copy command or the second copy command. The address in the host area 101 necessary to identify a copy source or copy destination is stored into the host controller main unit 122 by the process of S3.

FIG. 6 is a diagram for explaining the operation of the host 1 executing the first copy command. The first memory DMAC 124 reads out write data from the host area 101 under the control of the host controller main unit 122 (S31). Then the first memory DMAC 124 stores the read-out write data into the device area 102 under the control of the host controller main unit 122 (S32).

Here, the host controller main unit 122 has the CRC gen 128 generate a CRC code for each data of a predetermined size (hereinafter called unit data) in transferring write data from the host area 101 to the device area 102. The CRC codes, together with the write data, are stored into the device area 102.

Figure 7:
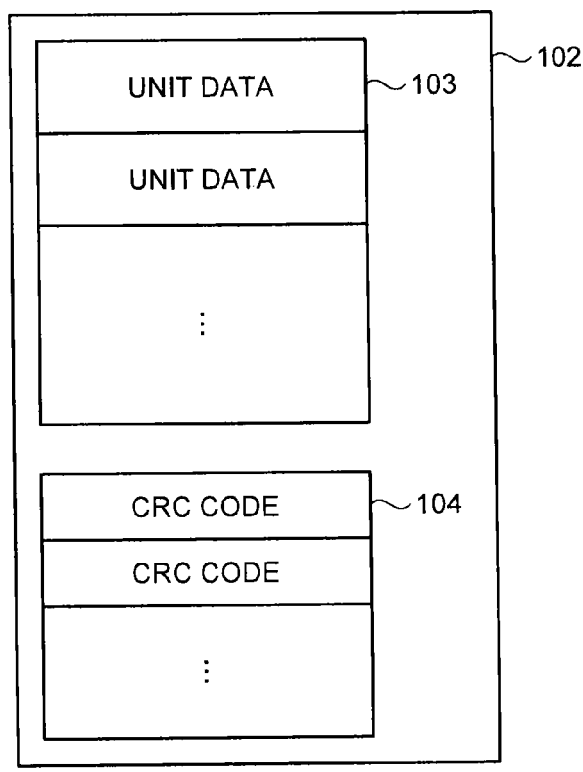
FIG. 7 is a diagram showing an example of the way in which CRC codes are stored.

FIG. 7 is a diagram showing an example of the way in which CRC codes are stored. In the example of FIG. 7, a data area 103 and a redundant area 104 are provided in the device area 102. A plurality of unit data are sequentially, consecutively stored into the data area 103 from its beginning. CRC codes corresponding to respective unit data are sequentially stored into the redundant area 104 from its beginning. The host controller main unit 122 controls the first memory DMAC 124 to store a CRC code corresponding to the unit data stored immediately before into the redundant area 104 each time it stores unit data into the data area 103. Then, the host controller main unit 122 controls the first memory DMAC 124 to store the next unit data at the location subsequent to the storing location of the last-stored unit data. Data to be stored in the data area 103 is the cache data 301, the management information 302, the code group 303, or the debug information 304.

Figure 8:
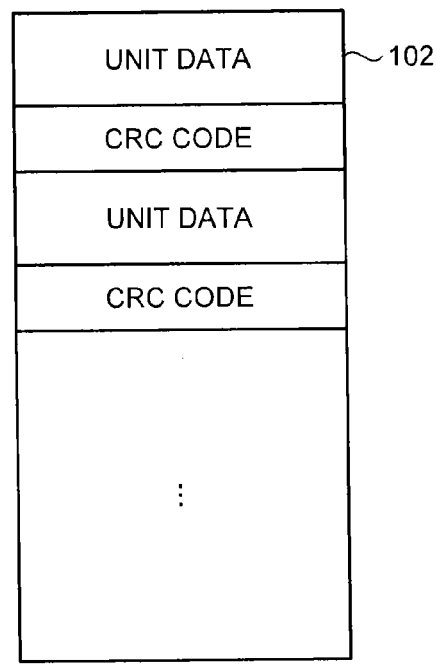
FIG. 8 is a diagram showing another example of the way in which CRC codes are stored.

FIG. 8 is a diagram showing another example of the way in which CRC codes are stored. In the example of FIG. 8, a plurality of pairs of unit data and a CRC code are sequentially, consecutively stored into the device area 102 from its beginning. The host controller main unit 122 controls the first memory DMAC 124 to store a CRC code at the location subsequent to the storing location of the unit data each time it stores unit data into the device area 102. Then, the host controller main unit 122 controls the first memory DMAC 124 to store the next unit data at the location subsequent to the storing location of the last-stored CRC code.

If determining that the device area 102 is filled with cache data 301 in the determination of S12 (Yes at S12), the device controller main unit 202 performs the saving of the cache data 301 (S14). After the saving, the device controller main unit 202 performs the process of S13.

Figure 9:
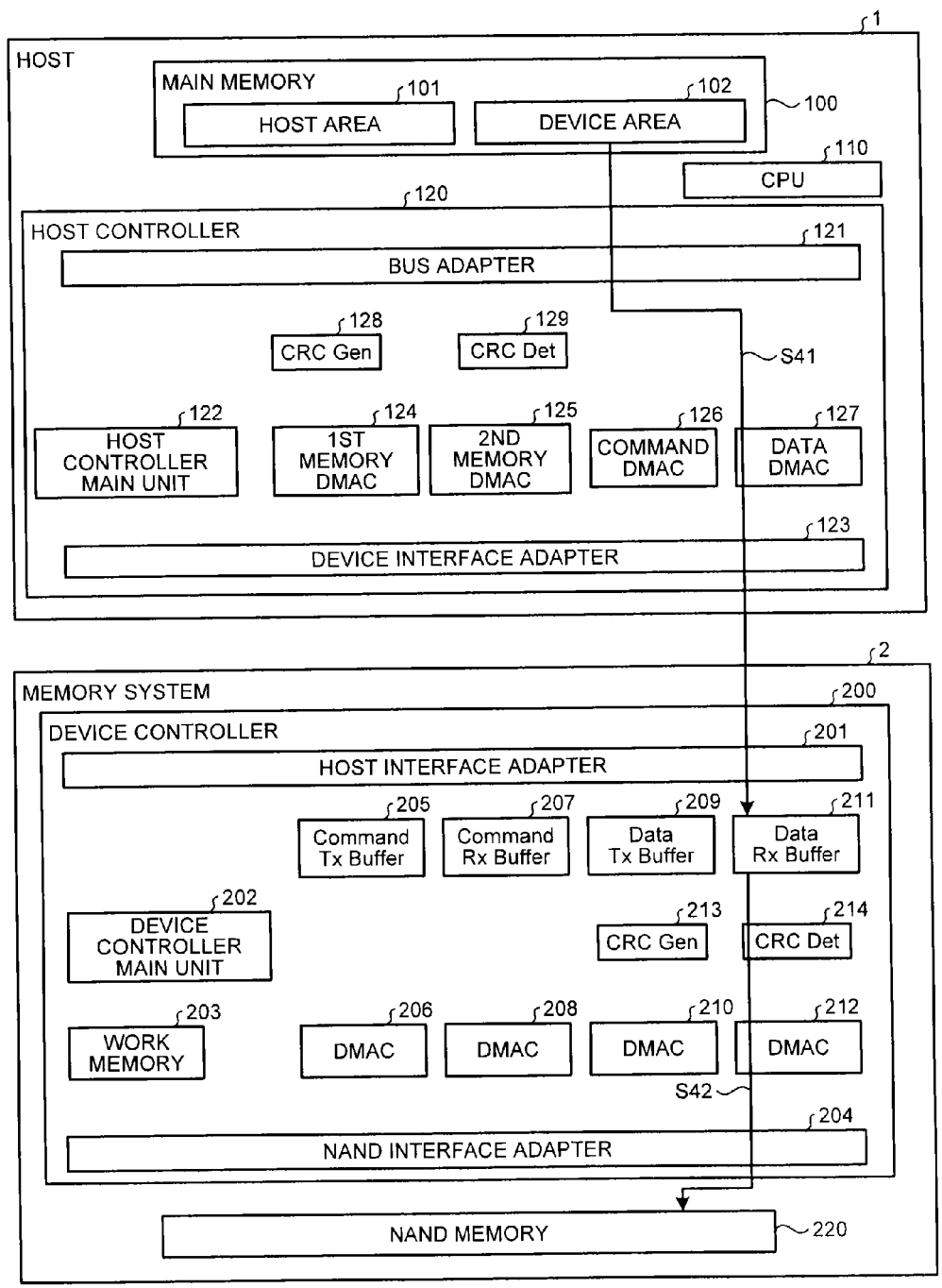
FIG. 9 is a diagram for explaining the operation of the information processing apparatus at the time of saving.

FIG. 9 is a diagram for explaining the operation of the information processing apparatus at the time of the saving. At the time of the saving, the device controller main unit 202 generates a read command to read data from the device area 102 and transmits to the host 1. Data to be read is the cache data 301. The read command is sent via the paths shown in FIG. 5 to the host controller main unit 122. When receiving the read command, the host controller main unit 122 starts controlling the data DMAC 127. The data DMAC 127 alternately reads unit data forming the cache data 301 and CRC codes for the respective unit data from the device area 102 under the control of the host controller main unit 122 and transmits the read unit data and CRC codes in the order in which they were read (S41). In the memory system 2, the unit data and CRC codes are stored into the data Rx buffer 211. The DMAC 212 transfers unit data stored sequentially into the data Rx buffer 211 to the NAND memory 220 (S42). In the process of S42, the CRC det 214 performs error detection on each of the unit data based on the corresponding CRC code and transmits the detection results sequentially to the device controller main unit 202.

If determining that the command read from the work memory 203 is not a write command in the determination of S11 (No at S11), that is, if that command is a read command, then the device controller main unit 202 determines whether data (hereinafter called read data) which that read command has requested to read is cached, as cache data 301, in the device area 102 (S15). If the read data is cached (Yes at S15), the device controller main unit 202 generates the second copy command to copy the read data from the device area 102 into the host area 101 and transmits to the host 1 (S16). Then the device controller main unit 202 finishes the operation. The second copy command is sent via the transfer paths shown in FIG. 5 to the host controller main unit 122.

Figure 10:
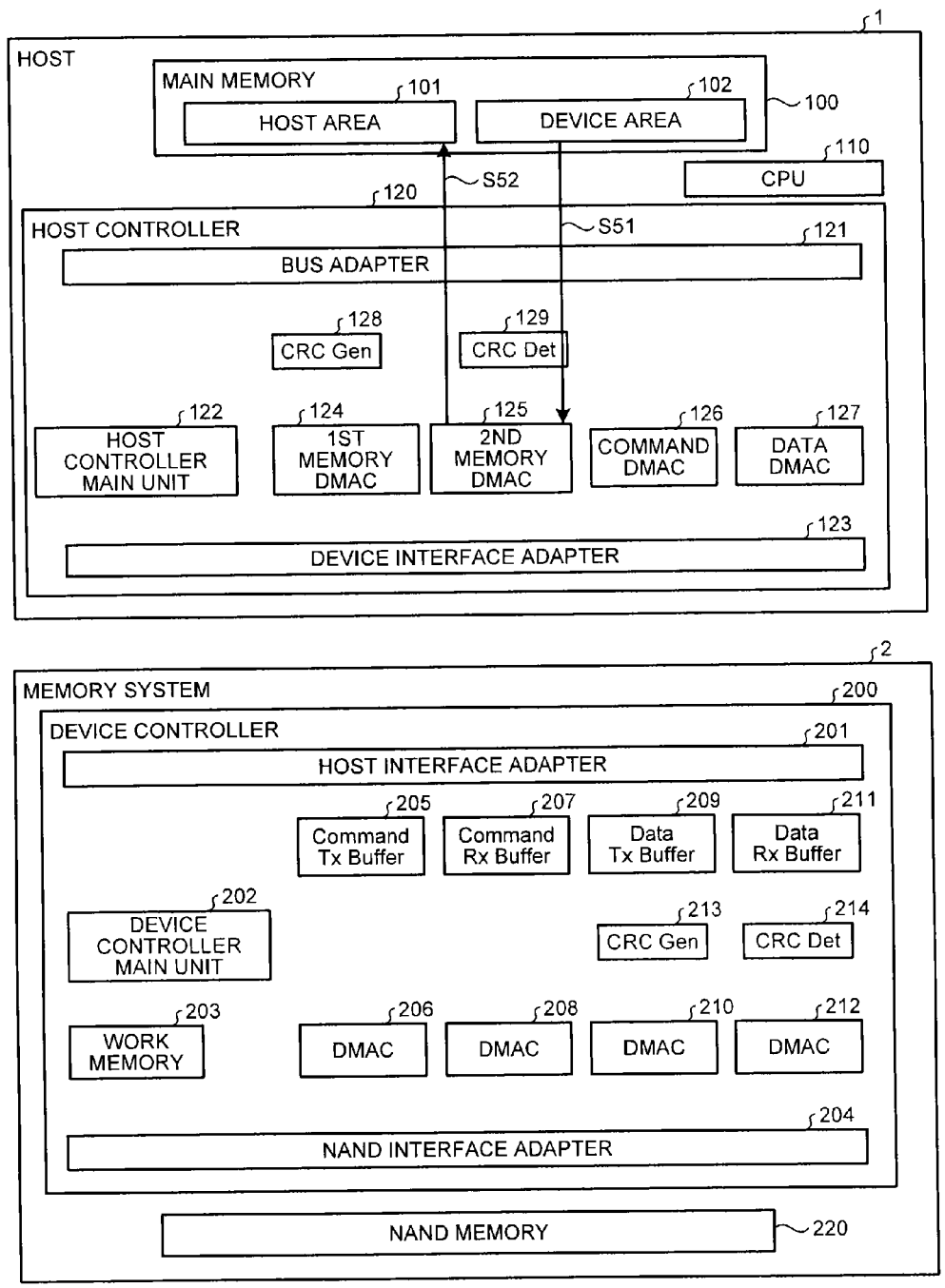
FIG. 10 is a diagram for explaining the operation of the host executing a second copy command.

FIG. 10 is a diagram for explaining the operation of the host 1 executing the second copy command. When receiving the second copy command, the host controller main unit 122 starts controlling the second memory DMAC 125. The second memory DMAC 125 reads out read data from the device area 102 under the control of the host controller main unit 122 (S51) and stores the read-out read data into the host area 101 (S52).

Here, the host controller main unit 122 has the second memory DMAC 125 alternately read unit data forming the read data and CRC codes corresponding to the respective unit data from the device area 102. The CRC det 129 performs error detection on each of the unit data based on the corresponding CRC code and transmits the detection results sequentially to the host controller main unit 122.

If determining that the read data is not cached in the determination of S15 (No at S15), then the device controller main unit 202 performs data transfer from the NAND memory 220 to the host area 101 (S17) and finishes the operation.

The data transfer from the NAND memory 220 to the host area 101 can be realized by, e.g., the following two methods. The first method is one in which, after read data is transferred from the NAND memory 220 to the device area 102, the read data in the device area 102 is transferred by the second copy command to the host area.

Figure 11:
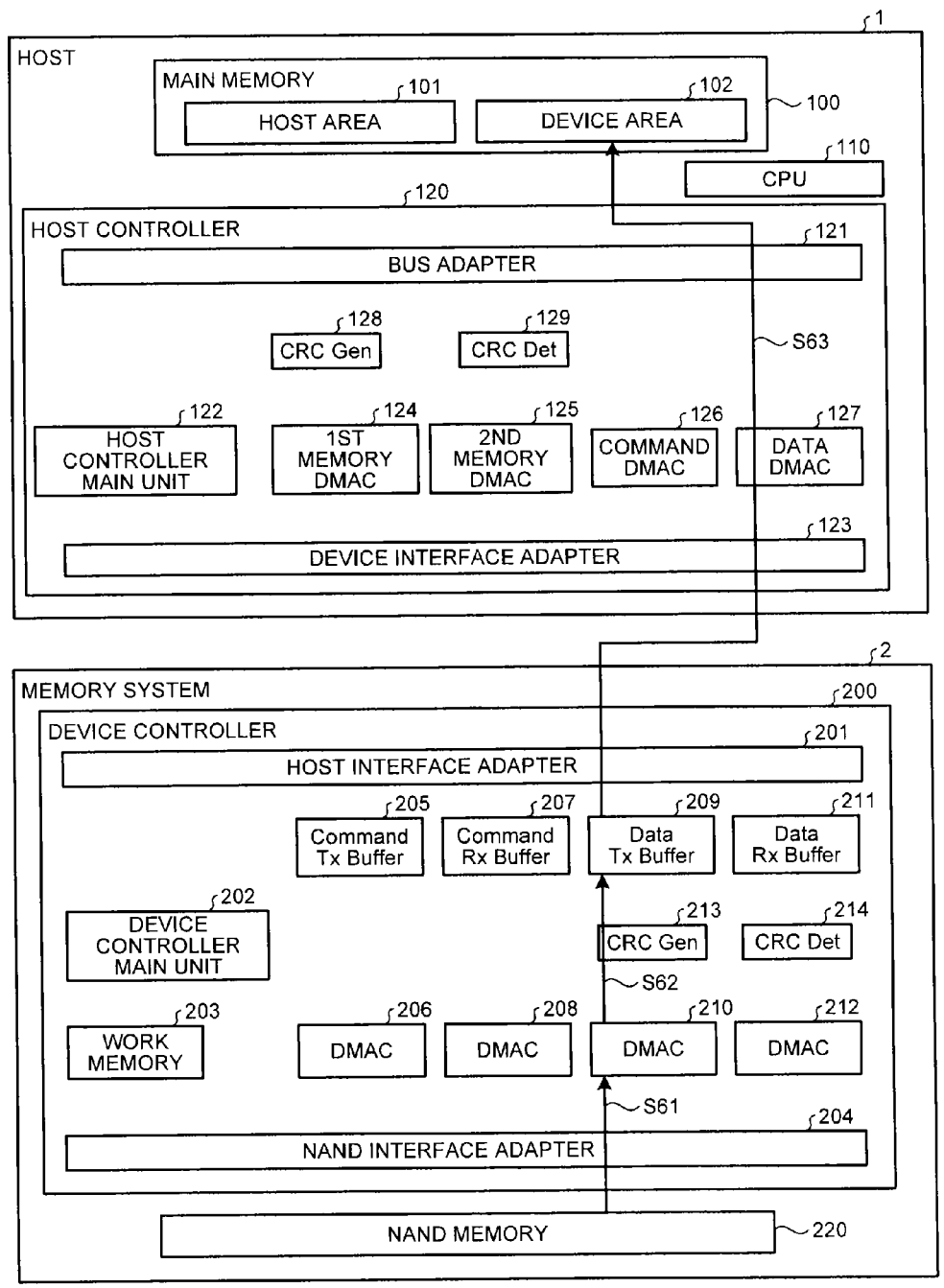
FIG. 11 is a diagram for explaining the operation of transferring read data from a NAND memory to the device area.

FIG. 11 is a diagram for explaining the operation of transferring read data from the NAND memory 220 to the device area 102. The DMAC 210 reads out read data from the NAND memory 220 under the control of the device controller main unit 202 (S61). Then the DMAC 210 stores the read-out read data into the data Tx buffer 209 (S62). The read data stored in the data Tx buffer 209 is transferred via the host interface adapter 201, the device interface adapter 123, the data DMAC 127, the bus adapter 121, and the bus 140 to the device area 102 and is stored as cache data 301 into the device area 102 (S63).

Here, the device controller main unit 202 has the CRC gen 213 generate a CRC code for each unit data in transferring read data destined for the device area 102. The CRC codes, together with the unit data, are stored into the device area 102. The device controller main unit 202 performs control of the storing destinations of the unit data and CRC codes. The device controller main unit 202 generates a write command, for example, for each of the unit data and CRC codes and transmits the generated write commands to the host 1 in advance. The write commands include the designation of the address of the storing destination for unit data or a CRC code to be written, and the designation of the address is interpreted by the host controller main unit 122. The designation of the address of the storing destination for unit data or a CRC code to be written is determined according to the method described using FIG. 7 or 8. The host controller main unit 122 controls the data DMAC 127 according to the interpreting result.

The second method that realizes the data transfer from the NAND memory 220 to the host area 101 is one in which read data is transferred from the NAND memory 220 to the host area 101 without passing through the device area 102.

Figure 12:
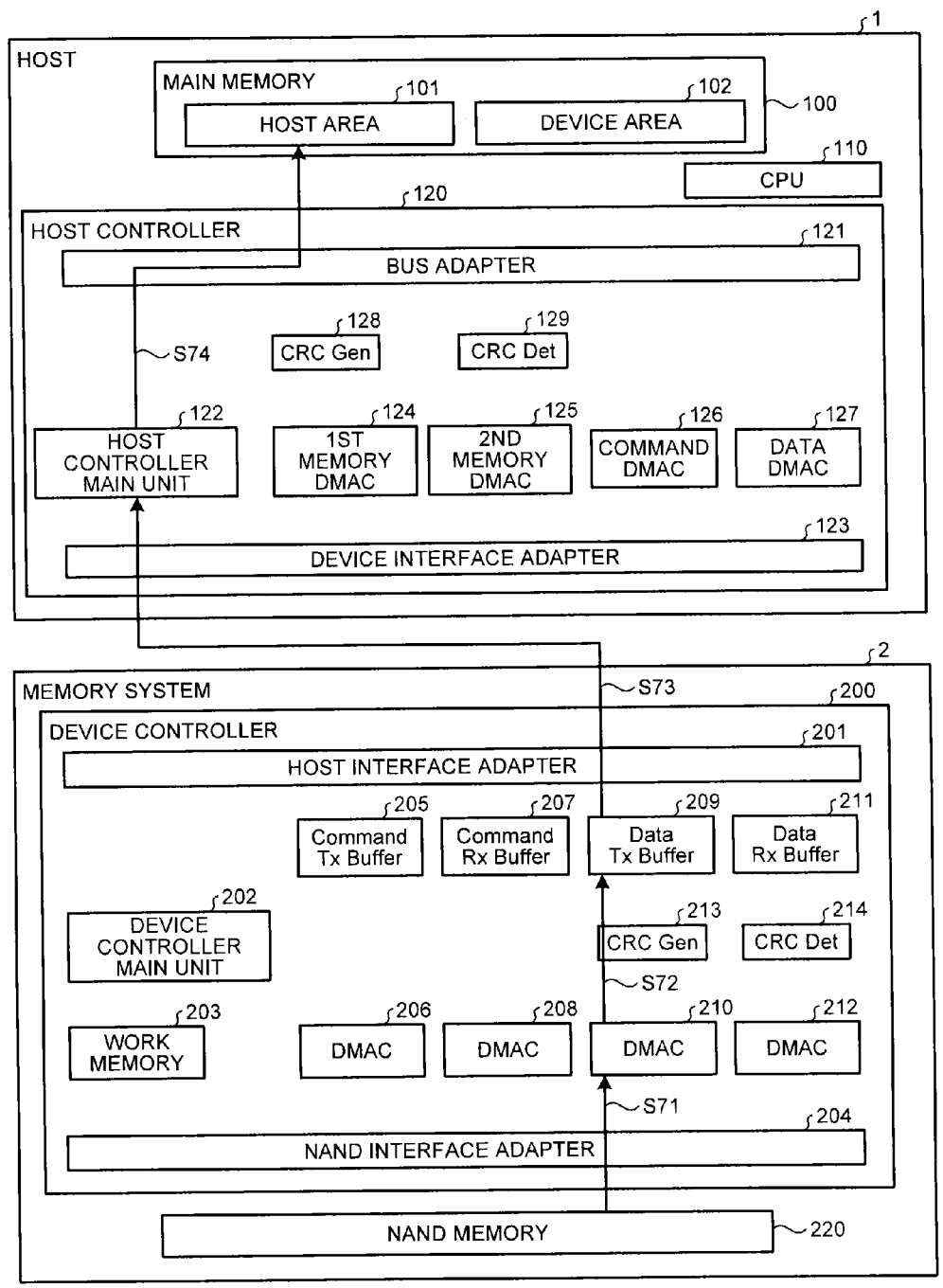
FIG. 12 is a diagram for explaining the operation of transferring read data from the NAND memory to a host area.

FIG. 12 is a diagram for explaining the operation of transferring read data from the NAND memory 220 to the host area 101. The DMAC 210 reads out read data from the NAND memory 220 under the control of the device controller main unit 202 (S71). Then the DMAC 210 stores the read-out read data into the data Tx buffer 209 (S72). Here, because the read data is not going to pass through the device area 102, the device controller main unit 202 turns off the function of the CRC gen 128. That is, the CRC gen 128 does not compute CRC codes. Thus, the read data read out from the NAND memory 220 is stored, as it is, into the data Tx buffer 209. The read data stored in the data Tx buffer 209 is sent via the host interface adapter 201 and the device interface adapter 123 to the host controller main unit 122 (S73). The host controller main unit 122 stores the sent read data into the host area 101 (S74). The storing location in the host area 101 is the location specified by the address stored by the process of S3.

As such, according to the embodiment of the present invention, the main memory 100 comprises the host area 101 that the host 1 uses and the device area 102 that the memory system 2 uses. In the case of transferring data to the device area 102, the information processing apparatus attaches a CRC code to the data. In the case of transferring data from the device area 102, the information processing apparatus reads the CRC code as well as the data and performs error detection on the data based on the read CRC code. Because error detection is performed on data stored in the device area 102, the occurrence of the error can be detected if an error occurs in data in the device area 102.

Note that in the case of writing write data into the memory system 2, the host 1 creates the write data in the host area 101. The write data is transferred from the host area 101 to the device area 102 by the host controller main unit 122 and the first memory DMAC 124. In transferring to the device area 102, the CRC gen 128 computes CRC codes of the write data.

Further, the device area 102 is used as a cache area to store cache data 301. The device controller main unit 202, DMAC 212, and data DMAC 127 transfer data cached in the device area 102 from the device area 102 to the NAND memory 220 in the saving process. The CRC det 214 performs error detection on data read from the device area 102 based on the corresponding CRC code.

In the case of the host 1 reading read data from the memory system 2, the host controller main unit 122 and the second memory DMAC 125 transfer read data cached in the device area 102 to the host area 101. The CRC det 129 performs error detection on read data read out from the device area 102 based on the corresponding CRC code.

In the case of the host 1 reading read data from the memory system 2, if the read data is not cached in the device area 102, the device controller main unit 202, DMAC 210, and data DMAC 127 transfer the read data from the NAND memory 220 to the device area 102. In transferring read data from the NAND memory 220 to the device area 102, the CRC gen 213 computes CRC codes.

Further, the device area 102 stores the management information 302, the code group 303, or the debug information 304. The management information 302, the code group 303, or the debug information 304 is stored in the NAND memory 220. The management information 302, the code group 303, or the debug information 304 is transferred from the NAND memory 220 to the device area 102 via the transfer paths explained using FIG. 11 at the time of startup and the like. In the case of transferring the management information 302, the code group 303, or the debug information 304 to the device area 102, the device controller main unit 202 generates a write command. The write command is sent via the transfer paths explained using FIG. 5 to the host controller main unit 122.

Further, the management information 302, the code group 303, or the debug information 304 is transferred via the transfer paths explained using FIG. 9 from the device area 102 to the NAND memory 220. In the transfer, the device controller main unit 202 generates a read command. The read command is sent via the transfer paths explained using FIG. 5 to the host controller main unit 122. Note that the management information 302, the code group 303, or the debug information 304 may be transferred by the DMAC 212 to the work memory 203 after error detection and then used in the work memory 203. The management information 302, the code group 303, or the debug information 304 after changed may be read from the work memory 203 and transferred to the device area 102 by the DMAC 212. At this time, the management information 302, the code group 303, or the debug information 304 after changed, together with CRC codes, which are computed by the CRC gen 213, is transferred to the device area 102.

As to data to be transferred to the device area 102, for each data of a predetermined size, a CRC code is computed and attached thereto. According to an example, the data area 103 and the redundant area 104 are provided in the device area 102. A plurality of unit data of the predetermined size are sequentially stored into the data area 103 from its beginning, for example. CRC codes computed from the corresponding unit data of the predetermined size are sequentially stored into the redundant area 104 from its beginning. Therefore, in the case where CRC codes are stored into the device area 102, the address of the storing destination of each data is the same as in the case where CRC codes are not stored, and hence the address management of the device area 102 becomes simple.

Further according to another example, the CRC code for the data is stored at the location subsequent to the storing location of data of the predetermined size in the device area 102, and the next data of the predetermined size is stored at the location subsequent to the storing location of that CRC code. Thus, the storing location of the data next to one data is obtained by adding the size of the CRC code to the end of the storing location of the one data, and hence the address management of the device area 102 becomes simple.

Although, in the above, description has been made supposing that CRC code is used as redundant information for error detection, any type of code can be applied as redundant information. A type of code capable of not only error detection but also error correction can also be applied.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An information processing apparatus which comprises a host and a memory system comprising a nonvolatile memory, the memory system being connected to the host, wherein the host comprises:
    a volatile memory that includes a first area to be used by the host and a second area as a cache memory to temporarily store data of the nonvolatile memory;
    a first host control unit that computes a first code and stores first data and the first code in the second area, the first code being redundant information of the first data; and
    a second host control unit that reads second data and a second code from the second area, the second data being data requested by the host to the memory system to be read, the second code being redundant information of the second data, performs error detection on the second data based on the second code, and transfers, in response to a first command for copying the second data into the first area, the second data to the first area, the first command being sent from the memory system to the host.

2. The information processing apparatus according to claim 1,
    wherein the first data is data being stored in the first area and being requested by the host to the memory system to be written therein, and
    wherein the first host control unit reads the first data from the first area and stores the read first data and the first code in the second area.

3. The information processing apparatus according to claim 2,
    wherein the memory system further comprises a first memory control unit that transmits a second command to read data from the second area to the host in a case where no space to cache the data requested by the host to be written is in the second area, and
    wherein the host further comprises a third host control unit that transmits third data and a third code that are stored in the second area to the memory system when receiving the second command, the third code being redundant information of the third data.

4. The information processing apparatus according to claim 3, wherein the memory system further comprises a second memory control unit that, when receiving the third data and the third code from the host, performs error detection on the third data based on the third code, and stores the third data in the nonvolatile memory.

5. The information processing apparatus according to claim 1, wherein the memory system, in a case where data requested by the host to be read exists in the second area, transmits the first command to the host.

6. The information processing apparatus according to claim 5, wherein the memory system further comprises a third memory control unit that, in a case where data requested by the host to be read is not in the second area, reads the requested data from the nonvolatile memory, computes a fourth code, the fourth code being redundant information of a fourth data, the fourth data being the read data, and transmits the fourth data and the fourth code to the second area.

7. The information processing apparatus according to claim 6, wherein the fourth data includes at least one of translation information that correlates logical addresses with physical addresses, error information of the memory system, or a program to control the memory system.

8. The information processing apparatus according to claim 1, wherein the size of the first data is fixed; the size of the second data is fixed; and the size of the first data and the size of the second data are the same.

9. The information processing apparatus according to claim 8,
wherein the second area includes a data storing area and a code storing area, and
wherein the first host control unit stores a plurality of the first data sequentially into the data storing area from the beginning thereof and stores a plurality of the first codes sequentially into the code storing area from the beginning thereof.

10. The information processing apparatus according to claim 9, wherein the second host control unit reads a plurality of the second data sequentially from the data storing area from the beginning thereof and reads a plurality of the second codes sequentially from the code storing area from the beginning thereof.

11. The information processing apparatus according to claim 8, wherein the first host control unit stores the first data at a first location, stores the first code at a second location subsequent to the first location, and, in the case of storing another first code in the second area, stores the other first code at a third location subsequent to the second location.

12. The information processing apparatus according to claim 11, wherein the second host unit reads the second code at a fourth location subsequent to the storing location of the second data in the second area and reads another second data, next to the second data, at a fifth location subsequent to the fourth location.

13. The information processing apparatus according to claim 1, wherein the nonvolatile memory is a NAND type flash memory.

14. The information processing apparatus according to claim 6, wherein the first to fourth codes are CRC codes.

* * * * *